United States Patent [19]

Zommer

[11] Patent Number: 5,063,307
[45] Date of Patent: Nov. 5, 1991

[54] INSULATED GATE TRANSISTOR DEVICES WITH TEMPERATURE AND CURRENT SENSOR

[75] Inventor: Nathan Zommer, Los Altos, Calif.

[73] Assignee: IXYS Corporation, San Jose, Calif.

[21] Appl. No.: 585,847

[22] Filed: Sep. 20, 1990

[51] Int. Cl.$^5$ .......................... G05F 3/26; H01L 29/78
[52] U.S. Cl. ...................................... 307/310; 357/28; 307/362
[58] Field of Search .................. 307/310, 362; 328/3; 323/313, 314, 289; 374/178; 357/28

[56] References Cited

U.S. PATENT DOCUMENTS

| | | | |
|---|---|---|---|
| 4,599,554 | 7/1986 | Jaycox et al. | 307/584 |
| 4,680,490 | 7/1987 | Baker et al. | 307/575 |
| 4,682,195 | 7/1987 | Yilmaz | 357/23.4 |
| 4,694,207 | 9/1987 | Heuwieser et al. | 307/571 |
| 4,779,123 | 10/1988 | Bencuya et al. | 357/23.4 |
| 4,783,690 | 11/1988 | Walden et al. | 357/23.14 |
| 4,785,207 | 11/1988 | Eng | 307/246 |
| 4,811,065 | 3/1989 | Cogan | 357/23.4 |
| 4,931,844 | 6/1990 | Zommer | 357/23.4 |

OTHER PUBLICATIONS

M. Glogolja, "Built-In Protection Makes TEMPFET Resistant To Catastrophic Failures", PCIM, Mar. 1989; pp. 19-22.

N. Zommer et al.; "Power Current Mirror Devices and Their Applications"; PCI Jun. 1986 Processing; pp. 275-283.

Harris Data Sheet; Current Sensing IGT Transistors Insulated Gate Bipolar Transistors.

*Primary Examiner*—Stanley D. Miller
*Assistant Examiner*—Sinh N. Tran
*Attorney, Agent, or Firm*—Townsend and Townsend

[57] ABSTRACT

A technique for sensing the temperature of power MOS devices contemplates a main transistor and monolithically formed sense transistor. A resistor, which may integrated into the device or may be off chip, is connected between the respective source nodes of the main transistor and the sense transistor (as in a normal current mirror). However, the respective gate nodes of the main transistor and the sense transistor are not directly connected to each other (in contrast to the normal current mirror configuration where the respective gate nodes of the main transistor and the sense transistor are directly connected). Rather, the sense transistor gate node is coupled to the output terminal of an operational amplifier. The amplifier, has a first input terminal coupled to a reference voltage and a second, complementary, input terminal coupled to the sense transistor source node.

6 Claims, 2 Drawing Sheets

INSULATED GATE TRANSISTOR DEVICES WITH TEMPERATURE AND CURRENT SENSOR

BACKGROUND OF THE INVENTION

The present invention relates generally to semiconductor devices, and more specifically to power insulated gate devices including MOSFETs (MOS field effect transistors and IGBTs (insulated gate bipolar transistors).

In controlling the application of electrical power to a load, it is a known practice to use a switching device in series with the load. Power MOS devices have proved very useful in this regard. The terms MOS (which originally stood for Metal-Oxide-Semiconductor) and MOSFET are used to refer to insulated gate devices generally, not withstanding the fact most modern devices have polysilicon gates rather than metal gates.

A power MOS device is often implemented as an array of switching cells (perhaps 10,000 in number) formed on a single chip, with each cell defining a microscopically small insulated gate transistor. In the case of MOSFET cells, respective gates, drains, and sources of the cells are connected in parallel to define the power MOSFET. In the case of IGBT cells, the respective gates, emitters, and collectors of the cells are connected in parallel to define the power IGBT.

During operation it is often desirable to sense various of the device's operating parameters, such as the current through the device and load, the voltage across the device, the power dissipated in the device, and the temperature of the device. The results of such sensing can be used to detect device and load efficiency, short circuit conditions, meltdown conditions, and the like.

U.S. Pat. No. 4,931,844, issued June 5, 1990, the disclosure of which is hereby incorporated by reference, describes the use of a current mirror technique for providing voltage, current, power, resistance and temperature sensing capability. In brief, the current mirror technique provides a relatively small number of cells on the chip, referred to as mirror cells, with their respective terminals connected in common with each other to define a monolithically formed sense transistor (also referred to as a mirror transistor, a current mirror, or simply a mirror).

In a typical current mirror configuration, the respective drain nodes of the main transistor and the sense transistor are connected together, and the respective gate nodes of main transistor and the sense transistor are connected together. A resistor is connected between the main transistor source node and the sense transistor source node. Assuming that the resistor has a resistance that is small compared to the on-resistance of the sense transistor, the voltage across the resistor will provide an indication of the current flowing through the sense transistor.

The sense transistor current is a known fraction of the main transistor current, being lower by a factor generally commensurate with the ratio of the number of sense transistor cells to main transistor cells. Actually the sense transistor current is generally proportionately larger.

In the forementioned U.S. Pat. No. 4,931,844, the temperature of the chip is determined by calculating the on-resistance of the chip and correlating that value with the known temperature dependence of the on-resistance. The on-resistance is determined from the voltage and current in the main transistor as determined on the basis of the sense transistor current. That approach is useful for measuring the temperature when the main transistor is in the conducting or on state.

Another approach to temperature sensing is shown in M. Glogolja, "Built in protection makes TEMPFET resistant to catastrophic failures," PCIM, March 1989, pp. 19–23. This approach provides an extra chip that is die attached to the top surface of the power device for temperature sensing. However, this solution may be unreliable, possibly adding contamination to the main power die if not carried out under scrupulously controlled conditions.

SUMMARY OF THE INVENTION

The present invention provides a technique for sensing the temperature of power MOS devices, either in the on or off state. The invention can be incorporated with normal current sensing.

In brief, the present invention contemplates a main transistor and a monolithically formed sense transistor. A resistor, which may integrated into the device or may be off chip, is connected between the respective source nodes of the main transistor and the sense transistor (as in a normal current mirror). However, the respective gate nodes of the main transistor and the sense transistor are not directly connected to each other (in contrast to the normal current mirror configuration where the respective gate nodes of the main transistor and the sense transistor are directly connected). Rather, the sense transistor gate node is coupled to the output terminal of an operational amplifier. The amplifier, has a first input terminal coupled to a reference voltage and a second, complementary, input terminal coupled to the sense transistor source node.

The sense transistor is thus connected in a current source configuration where the amplifier controls the sense transistor gate node so to maintain the voltage at the sense transistor source node substantially equal to the reference voltage. The gate voltage required to sustain a particular amount of current through the sense transistor has a known linear temperature dependence. Thus, the temperature of the die is determined by sensing the voltage at the operational amplifier output terminal (equivalently the sense transistor gate node), and comparing the sensed voltage to the calibration table of the device.

A switching arrangement that disconnects the operational amplifier output terminal from the sense transistor gate node and directly connects the main transistor gate node and sense transistor gate node allows the sense transistor to be used as a current mirror to provide current sensing in the normal way.

A further understanding of the nature and advantages of the present invention may be realized by reference to the remaining portions of the specification and the drawings.

DESCRIPTION OF SPECIFIC EMBODIMENTS

Power Chip Construction

Figure 1:
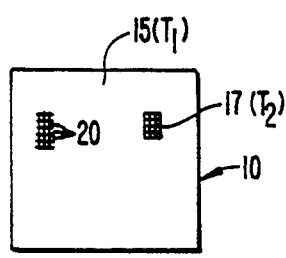
FIG. 1 is a simplified top view of a power MOS chip having a sense transistor that may be used for either temperature or current sensing.

FIG. 1 is a top view showing, in stylized form, a MOS power chip 10 having temperature and current sensing capabilities according to the present invention. For simplicity, bond pads and external connections are not shown. A major part 15 of the active chip area is devoted to a main transistor switch, designated $T_1$, while a smaller part 17 is devoted to a sense transistor, designated $T_2$. According to well known practice, each of transistors $T_1$ and $T_2$ is actually implemented as a number of small cells 20. For example, the main transistor might comprise 10,000 cells while the sense transistor might comprise 10 cells. While the ratio of the number of cells is 1000:1, the current ratio in operation is about 700:1.

Figure 2A:
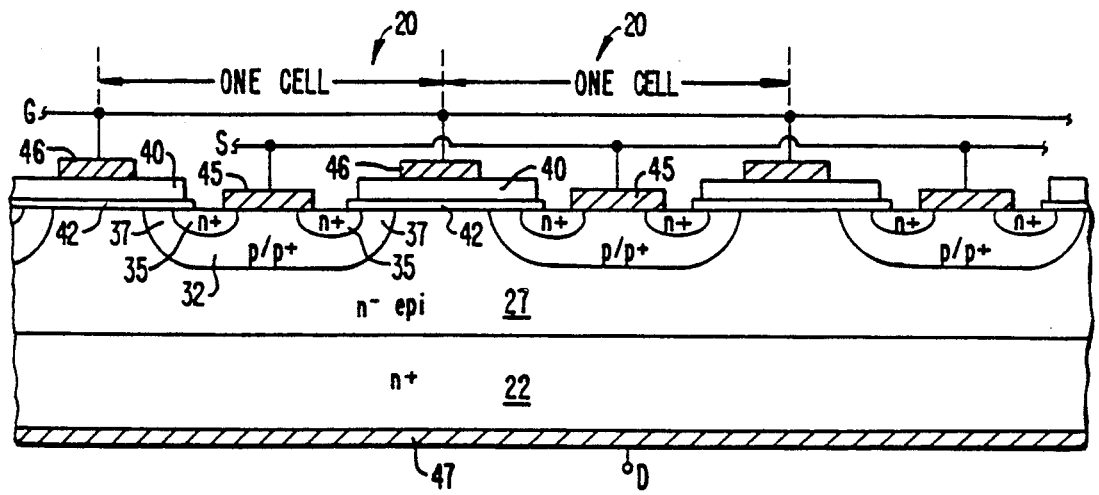
FIGS. 2A and 2B are cross-sectional and top views showing suitable cell structure and layout for n-channel devices.

FIG. 2A is a sectional view showing a suitable cell structure for an n-channel enhancement mode power MOSFET. Chip 10 is preferably fabricated by a double-diffusion MOS (DMOS) process, as is well known in the art. (As alluded to above, the use of the term "MOS" or "MOSFET" is not intended to imply a metal gate).

An n+ substrate 22 has an n− epitaxial (epi) layer 27 is formed on its surface and the active regions are formed therein. A typical cell 20 comprises a p/p+ body 32 (p-well) formed in epi layer 27 and an n+ source region 35 formed within the perimeter of body 32. Body 32 is p-type over most of its lateral extent with one or more central regions doped p+. The portion of body 32 adjacent the surface and between the source region and the n− epi layer defines a channel region 37.

A polysilicon layer 40 overlies the channel region and the regions between cells, and is separated from the epi surface by a thin layer 42 of gate oxide. The polysilicon extends over the surface of the all the cells in the transistor with an opening at each cell (for source and body metallization).

A top metal layer is patterned so as the define portions 45 and 46. Portion 45 makes ohmic contact with the n+ source region (as well as p/p+ body) of each of the cells so as to define a common source node for that transistor. Portion 46 of the top metal layer provides a low resistance connection to the polysilicon gate portions of each of the cells so as to define a common gate node G for that transistor.

Since there are two separate transistors on the chip, polysilicon layer portions 45 and 46 are each segmented into two parts corresponding to parts 15 and 17 of the chip area (i.e., transistor $T_1$ and $T_2$). This defines separate gate nodes $G_1$ and $G_2$ and separate source nodes $S_1$ and $S_2$. A metal layer 37 is formed on the bottom surface of the substrate to form a drain electrode D common to all cells of the device.

Figure 2B:
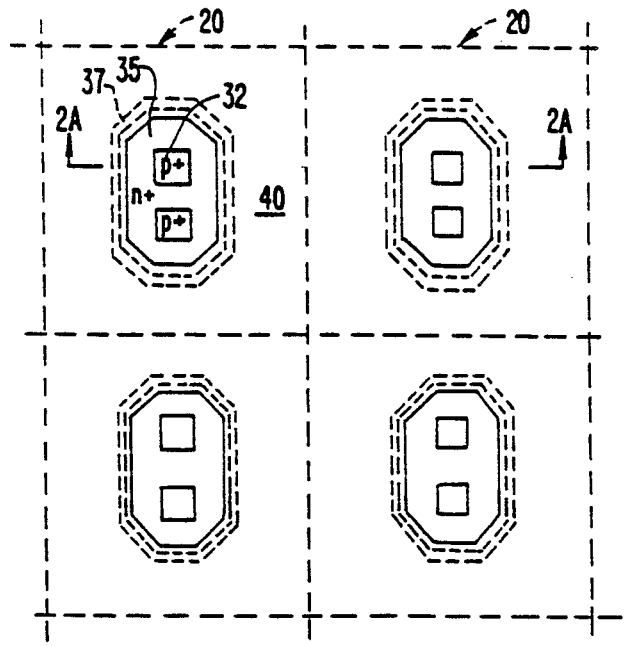

FIG. 2B shows a simplified top view of a typical cell layout. The solid octagon denotes the opening in the gate polysilicon layer while the dashed lines show channel region 37 under the gate (bounded by the p-well boundary and the source region boundary). This particular type of cell has the n+ source region formed so that the body portion contacts the epi surface in two regions (denoted by solid rectangles). The contact opening for the source/body contact extends over both these regions and the intermediate n+ region. This type of cell is described in U.S. Pat. No. 4,860,072, issued Aug. 22, 1989.

The fabrication process for n-channel devices may be briefly outlined as follows:

(1) Provide an n+ substrate.
(2) Grow n− epitaxial layer.
(3) Grow localized field oxide to define peripheral non-active areas of the chip.
(4) Deposit gate oxide.
(5) Deposit polysilicon over gate oxide.
(6) Create openings in the polysilicon and gate oxide to define the cells.
(7) Implant p-type dopants aligned to polysilicon openings.
(8) Implant p+ regions within the openings (non-critical alignment).
(9) Diffuse to form p-well (body).
(10) Mask at least portions of p+ diffusion and implant n+.
(11) Diffuse to form source regions and channel regions.
(12) Deposit CVD oxide over wafer.
(13) Etch poly contacts and source/body contacts.
(14) Deposit metal layer.
(15) Etch metal layer to define gate electrodes and source/body electrodes.
(16) Passivate.

The process can be used to make either MOSFETs or IGBTs. The process outlines above is for MOSFETs. IGBTs could be made by a similar process modified by providing a p+ substrate and then optionally doping the upper portion of the p+ substrate n+ prior to growing the n− epitaxial layer.

Figure 3A:
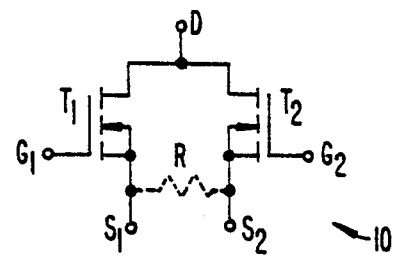
FIGS. 3A and 3B are circuit schematics of n-channel MOSFET and IGBT embodiments of the chip of FIG. 1.

FIG. 3A is an equivalent circuit schematic of chip 10 when fabricated as a MOSFET. The cells in main transistor $T_1$ are connected in parallel with their gates commonly connected to define a main transistor gate node $G_1$, and their sources commonly connected to define a main transistor source node $S_1$. Similarly, the cells in sense transistor $T_2$ have their gates commonly connected to define a sense transistor gate node $G_2$, and their sources commonly connected to define a sense transistor source node $S_2$. The cells of each of the main and sense transistors have their drains commonly connected to define a common drain node D.

A resistor R is connected between source nodes $S_1$ and $S_2$. The resistor has a value on the order of 100Ω to 10K, which is generally less than the on-resistance of the sense transistor. The resistor is shown in phantom since it may be integrated onto the chip, or provided as an external circuit element. In either event, chip 20 has five external pins.

Figure 3B:
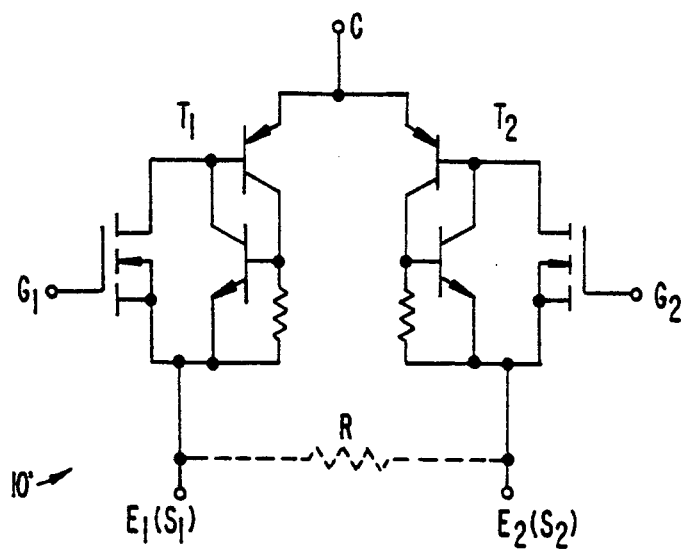

FIG. 3B is an equivalent circuit schematic of the chip, designated 10′ when fabricated as a power IGBT. In this configuration, there is a common collector node C corresponding to the substrate, a main transistor gate node $G_1$, a main transistor emitter or source node $S_1$, a sense transistor gate node $G_2$, and a sense transistor emitter or source node $S_2$. As before, a resistor R between the two source nodes may be provided on-chip or off-chip.

Temperature Sensing

Figure 4:
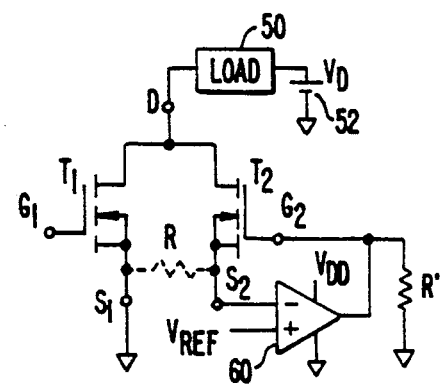
FIG. 4 is a circuit schematic of the n-channel MOSFET embodiment with external circuitry for temperature sensing.

FIG. 4 shows the MOSFET embodiment in combination with a load 50, a power supply 52, and external temperature sensing circuitry. Load 50 is connected between the high voltage terminal of the power supply and common drain terminal D. To the extent that resistor R is not provided on chip, it is connected externally between main transistor source node $S_1$ and sense transistor source node $S_2$. Source node $S_1$ is grounded.

An operational amplifier 60 is connected with its non-inverting input terminal held at a reference voltage $V_{ref}$, its inverting input terminal coupled to source node $S_2$, and its output terminal coupled to sense transistor gate node $G_2$. Thus, sense transistor is connected in a current source configuration with amplifier 60 providing feedback to guarantee that the current through sense transistor $T_2$ is maintained very near ($V_{ref}/R$).

It is property of MOSFETs and IGBTs that the gate voltage (relative to the source) needed to sustain a given current through the device goes down with temperature at a rate typically on the order of 5 mv/°C. The actual coefficient depends primarily on the process details and specific device structure, and to a lesser extent on the given current. Thus, the gate voltage required to maintain this current is a known function of temperature, and a measurement of this voltage provides a measurement of the temperature. A resistor R' having a high value (say 50 KΩ to 1 MΩ) may be coupled between gate node $G_2$ and ground to ensure that the sense transistor is off when no signal is presented at its gate.

In addition to providing a relatively linear diagnostic of temperature, the gate voltage provides an indication of other possible abnormal conditions. For example, should there be a break in the line between power supply 52 and drain node D, amplifier 60 will drive gate node $G_2$ the to maximum possible voltage in an attempt to bring the current to the right value ($V_{ref}/R$), which will show up as an abnormal condition.

Although not shown in the schematic, MOS power chip 10 is often used in combination with a driver chip which supplies signals to main transistor gate node $G_1$. Amplifier 60, resistor R', and possibly resistor R may be discrete elements, or may be integrated on the driver chip. The schematic shows the amplifier power supply as being different from the power supply to the load. This is sometimes, but not always the case. Also, the load is shown connected between the power supply and the drain, but this is not necessary. The load could be connected between source node $S_1$ and ground, in which case, $V_{ref}$ and the amplifier power supply would have to be referenced to source node $S_1$.

Figure 5:
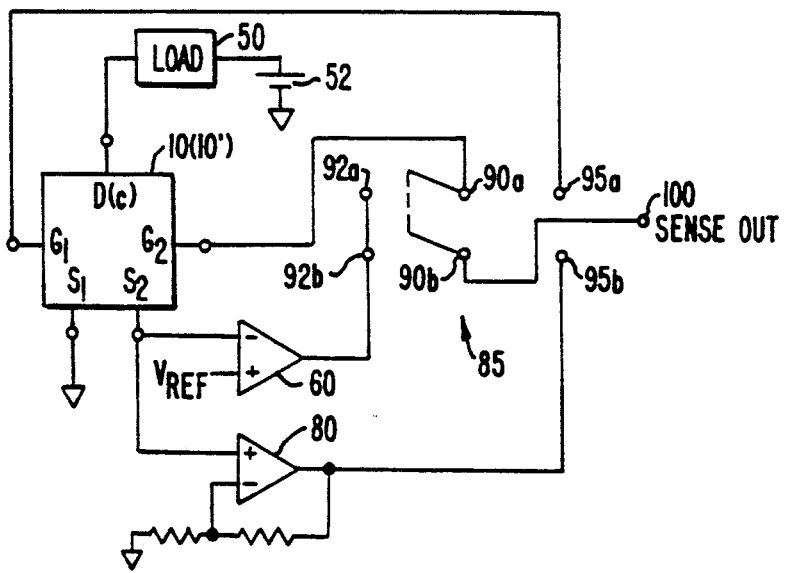
FIG. 5 is a circuit schematic of the MOSFET embodiment with external circuitry for providing temperature and current sensing.

FIG. 5 is a circuit schematic showing a switching arrangement that allows chip 10 or 10' to be used for both temperature and current sensing. In this embodiment, amplifier 60 is provided for temperature sensing as described above and a separate amplifier 80 is provided for current sensing. A double-pole double-throw switch 85 has a pair of movable contacts 90a and 90b, switchable to make contact with either a first pair of terminals 92a and 92b in a first position or a second pair of terminals 95a and 95b in a second position. Contact 90a is connected to gate node $G_2$ and contact 90b is connected to a sense output node 100 that provides the sensed voltage that represents temperature or current. Terminals 92a and 92b are connected together and to the output terminal of amplifier 60. Terminal 95a is connected to gate node $G_1$ and terminal 95b is connected to the output of amplifier 80. As in the case of FIG. 4, the amplifiers, resistors, and the switch can be integrated onto the driver chip.

In the first switch position, used for temperature sensing, contact 90a is connected to terminal 92a and contact 90b is connected to terminal 92b. This results in gate node $G_2$ being connected to the output of amplifier 60 and to the sense output node. In the second switch position, used for current sensing, contact 90a is connected to terminal 95a, thereby connecting the gate nodes $G_1$ and $G_2$ together, and contact 90b is connected to terminal 95b, thereby providing the output of amplifier 80 on the sense output node. A possible center off position is provided where no sensing is desired. In this position, no signal is applied to sense transistor gate node $G_2$ and neither amplifier drives the sense output node.

Figure 6:
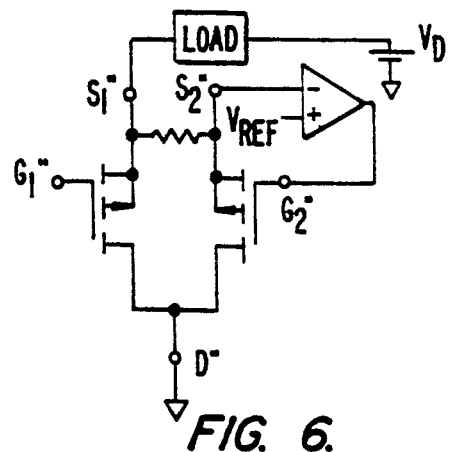
FIG. 6 is a circuit schematic of a p-channel MOSFET embodiment with external circuitry for temperature sensing.

FIG. 6 is a circuit schematic showing the connections for temperature sensing with a p-channel MOSFET embodiment. Double primes are used on the node identifiers corresponding to those in FIG. 4. The figure also illustrates having the load connected between the source and the power supply. If desired, a switching arrangement similar to that shown in FIG. 5 could be used.

Conclusion

In conclusion, it can be seen that the present invention provides a simple and effective method of temperature sensing. The sense transistor is readily fabricated in the normal fabrication process, and can also be used for current sensing.

While the above is a complete description of the preferred embodiment, various modifications, alternative constructions, and equivalents may be used. For example, FIG. 5 shows an embodiment where two separate amplifiers are provided for temperature and current sensing, with suitable switching. A more complex switching arrangement could be provided that would allow the use of a single amplifier, with various resistors and other components switched in and out to change the amplifier's operation.

Similarly, U.S. Pat. No. 4,931,844 discloses a technique where a single current mirror is used for current and voltage sensing with a switched resistor network. Again, the technique disclosed in that patent could be applied to the current sensing mode of the present invention so as to provide voltage sensing as well.

Therefore, the above description and illustration should not be taken as limiting the scope of the present invention which is defined by the claims.

What is claimed is:

1. A semiconductor device in combination with temperature sensing circuitry comprising:
   a first insulated gate transistor having a first drain node, a first gate node, and a first source node;
   a second insulated gate transistor, monolithic with and much smaller than said first transistor, having a second drain node, a second gate node, and a second source node;
   said first and second drain nodes having a common connection;
   a resistor coupled between said first and second source nodes;
   means defining a reference voltage; and
   an operational amplifier having a first input terminal coupled to said reference voltage, a second complementary input terminal coupled to said second source node, and an output terminal coupled to said second gate node;

whereupon when current flows from said second drain node, through said second gate insulated transistor, through said resistor, and to said second source node, the voltage appearing at said second gate terminal provides a direct measure of the temperature of said second insulated gate transistor.

2. The combination device of claim 1 wherein said first and second insulated gate transistors are MOSFETs.

3. The combination device of claim 1 wherein said first and second insulated gate transistors are IGBTs.

4. The combination of claim 1, and further comprising switching means for disconnecting said operational amplifier's output terminal from said second gate node and for connecting said second to said first gate node, whereby the voltage appearing across said resistor provides a representation of the current flowing through the device.

5. The combination of claim 1 wherein said first and second insulated gate transistors are n-channel enhancement mode devices.

6. The combination of claim 1 wherein said resistor is formed monolithically with said first and second insulated gate transistors.

* * * * *